United States Patent
Yamashita

(10) Patent No.: US 10,175,284 B2
(45) Date of Patent: Jan. 8, 2019

(54) CIRCUIT BOARD TESTING APPARATUS AND CIRCUIT BOARD TESTING METHOD

(71) Applicant: NIDEC-READ CORPORATION, Kyoto (JP)

(72) Inventor: Munehiro Yamashita, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 511 days.

(21) Appl. No.: 14/876,846

(22) Filed: Oct. 7, 2015

(65) Prior Publication Data

US 2016/0103172 A1  Apr. 14, 2016

(30) Foreign Application Priority Data

Oct. 8, 2014 (JP) ................................. 2014-206975

(51) Int. Cl.
*G01R 31/02* (2006.01)
*G01R 31/28* (2006.01)

(52) U.S. Cl.
CPC ....... *G01R 31/026* (2013.01); *G01R 31/2812* (2013.01)

(58) Field of Classification Search
None
See application file for complete search history.

(56) References Cited

U.S. PATENT DOCUMENTS 5,744,964 A * 4/1998 Sudo .................. G01R 31/2805
324/519

2004/0041556 A1 * 3/2004 Martin ............... G01R 1/07314
324/750.24
2006/0290363 A1  12/2006 Botelho
(Continued)

FOREIGN PATENT DOCUMENTS

JP           2003-279595 A      10/2003
JP      WO 2008041678 A1 *    4/2008  ......... G01R 31/2812
JP           2010-014508 A       1/2010
(Continued)

OTHER PUBLICATIONS

Yotsuya, "Fundamentals for Electrical Resistance Measurement at Low Temperatures", Teion Kogaku (Journal of Cryogenics and Superconductivity Society of Japan), Oct. 17, 1991, p. 217-220, vol. 27 No. 3 (1992).

(Continued)

*Primary Examiner* — Melissa Koval
*Assistant Examiner* — Courtney McDonnough
(74) *Attorney, Agent, or Firm* — Viering, Jentschura & Partner MBB

(57) ABSTRACT

In a circuit board testing apparatus for performing a four-terminal measurement method on a wiring pattern formed of a plurality of wires on a circuit board, a control part connects in series contact probes to be connected to upstream-side voltage detection terminals or downstream-side voltage detection terminals, via connection terminals, allows a power supply part to apply power between the test points with which the contact probes connected in series are in contact, allows a voltage detection part to detect a voltage between the test points, and makes a determination as to conductive contact states of the contact probes with the test points, based on the detected voltage.

20 Claims, 6 Drawing Sheets

(56) References Cited

U.S. PATENT DOCUMENTS

2014/0285929 A1\*  9/2014  Lorenzi ............... G01R 31/025
                                                361/42

FOREIGN PATENT DOCUMENTS

JP       2011-007687 A     1/2011
JP       2013024724 A     2/2013

OTHER PUBLICATIONS

Office Action received for Japanese Patent Application No. 2014-206975, dated Jul. 3, 2018, 3 pages and 3 pages of English translation.

\* cited by examiner

CIRCUIT BOARD TESTING APPARATUS AND CIRCUIT BOARD TESTING METHOD

CROSS-REFERENCE TO RELATED APPLICATION

This application is based on and claims priority from Japanese Patent Application No. 2014-206975, filed on Oct. 8, 2014, the contents of which are hereby incorporated by reference in their entirety.

TECHNICAL FIELD

This disclosure relates to a circuit board testing apparatus and circuit board testing method for conducting a test on circuit boards. More specifically, the disclosure relates to a circuit board testing apparatus and circuit board testing method capable of easily confirming a contact state of a contact probe of a testing jig with a test point on a circuit board in a short time, in a test to be conducted by bringing the contact probe into contact with the test point.

The disclosure is applicable to a test to be conducted on electrical wiring on various circuit boards and semiconductor wafers including, in addition to printed wiring boards, flexible circuit boards, multilayer wiring boards, electrode plates for use in liquid crystal displays and plasma displays, electrode plates for use in touch panels, and package substrates and film carriers for use in semiconductor packages. Herein, these circuit boards to be subjected to the test will be collectively referred to as "circuit boards".

BACKGROUND

Wires are formed on a circuit board in order to transmit and receive electric signals to and from ICs (Integrated Circuits), semiconductor components, and other electronic components mounted on the circuit board. With recent miniaturization of electronic components, wires which are connected to the electronic components have been formed more miniaturized and complicated. Moreover, these wires have been formed to have lower resistance than ever before.

Higher accuracy methods are required to conduct wire defect tests on such wires. Due to the resistance of the miniaturized wire, slight error or poor accuracy causes an incorrect result of a test as to whether or not a resistance value of each wire is acceptable.

Particularly, signal wires are formed finer on a circuit board so as to be of low resistance. Therefore, a two-terminal measurement method fails to calculate an accurate resistance value of each signal wire because of a significant influence of contact resistance. In order to overcome such a disadvantage, a four-terminal measurement method has been employed, which does not undergo the influence of contact resistance.

The four-terminal measurement method does not take the contact resistance into consideration. In conducting a test, therefore, a terminal (contact probe) for power supply and a terminal for detection and measurement are brought into contact with each test point defined on a wire to be subjected to the test.

As wires are formed finer on a circuit board, a testing jig for use in the four-terminal measurement method has a plurality of contact probes disposed with narrower pitches. In the four-terminal measurement method, particularly, a contact probe for power supply and a contact probe for detection and measurement (a pair of contact probes) are disposed with considerably narrower pitches.

In performing the four-terminal measurement method, as described above, two contact probes are brought into conductive contact with one test point. Prior to the measurement of a resistance value between test points in the four-terminal measurement method, therefore, it is determined whether or not two contact probes are in conductive contact with each test point. In order to determine whether or not two contact probes are in conductive contact with a test point set in advance, the four-terminal measurement method involves applying a current to one of the contact probes and detecting the current flowing into the other contact probe via the test point. If the current from the other contact probe cannot be detected, it is determined that one of the two contact probes is not in conductive contact with the test point. In order to achieve a favorable conductive contact state, a testing jig is spaced apart from the circuit board, and then is brought into contact with the circuit board again.

According to the four-terminal measurement method, conductive contact states of two contact probes with a test point are confirmed for each test point. The four-terminal measurement method involves performing a measurement for confirming a conductive contact state of a contact probe with a test point defined on one end of a wire, performing a measurement for confirming a conductive contact state of a contact probe with a test point defined on the other end of the wire, and measuring a resistance value between the test points. Therefore, the four-terminal measurement method requires measurements which are three times as large as that of the ordinary two-terminal measurement method. Hence, an increase in time for the test causes a reduction in productivity.

JP 2013-024724 A discloses a method for confirming conductive contact states of two contact probes with a test point (i.e., performing a contact check) in a four-terminal measurement method. According to the method in JP 2013-024724 A, in order to reduce time for the contact check, conductive contact states of two contact probes with a test point on one end of a wire to be subjected to a test are confirmed in a state in which the contact probes are connected in series.

However, the method in JP 2013-024724 A involves performing a test measurement with contact probes, which are in conductive contact with a test point on one end of a wire to be subjected to a test, connected in series, and performing a test measurement with contact probes, which are in conductive contact with a test point on the other end of the wire, connected in series. That is, at least two test measurements are performed for the contact check.

According to the method in JP 2013-024724 A, moreover, if the two contact probes are short-circuited, a closed circuit is formed although the two contact probes are not in conductive contact with the test point. As a result, it is erroneously determined that the contact probes are in conductive contact with the test point.

SUMMARY

In view of the circumstances described above, an exemplary embodiment of the disclosure provides a circuit board testing apparatus and circuit board testing method capable of easily confirming conductive contact states of contact probes with a test point in a short time, in a four-terminal measurement method.

A first aspect of the disclosure provides a circuit board testing apparatus for conducting a continuity test on a wiring pattern formed of a plurality of wires on a circuit board, and performing a four-terminal measurement on test points defined on each wire with a pair of contact probes brought into conductive contact with each test point, in the continuity test. The circuit board testing apparatus includes: a power supply part configured to apply power between the test points; upstream-side power supply terminals provided for the contact probes in a one-to-one correspondence and connectable to an upstream side of the power supply part; downstream-side power supply terminals provided for the contact probes in a one-to-one correspondence and connectable to a downstream side of the power supply part; a voltage detection part configured to detect a voltage between the test points; upstream-side voltage detection terminals provided for the contact probes in a one-to-one correspondence and connectable to an upstream side of the voltage detection part; downstream-side voltage detection terminals provided for the contact probes in a one-to-one correspondence and connectable to a downstream side of the voltage detection part; connection terminals provided for the contact probes in a one-to-one correspondence to connect the contact probes to one another; a selection part configured to selectively connect the contact probes to the respective terminals; and a control part configured to operate the power supply part, the voltage detection part, and the selection part to stimulate measurement processing for performing the four-terminal measurement. In the circuit board testing apparatus, the control part connects in series the contact probes to be connected to the upstream-side voltage detection terminals or the downstream-side voltage detection terminals, via the connection terminals. Moreover, the control part allows the power supply part to apply power between the test points with which the contact probes connected in series are in contact, allows the voltage detection part to detect a voltage between the test points, and makes a determination as to conductive contact states of the contact probes with the test points, based on the detected voltage.

A second aspect of the disclosure provides the circuit board testing apparatus of the first aspect, in which the control part allows the power supply part to apply power from the upstream side and then apply power from the downstream side, and makes the determination as to the conductive contact states.

A third aspect of the disclosure provides a circuit board testing method for conducting a continuity test on a wiring pattern formed of a plurality of wires on a circuit board, and performing a four-terminal measurement on test points defined on each wire, using upstream-side power supply terminals and downstream-side power supply terminals for applying power between the test points and upstream-side voltage detection terminals and downstream-side voltage detection terminals for detecting a voltage between the test points, with a pair of contact probes brought into conductive contact with each test point, in the continuity test. The circuit board testing method includes: connecting in series the contact probes to be connected to the upstream-side voltage detection terminals or the downstream-side voltage detection terminals; applying power to the contact probes connected in series to perform an electrical measurement between the contact probes connected in series; calculating an electrical characteristic between the contact probes connected in series, from the power and a result of the electrical measurement; and making a determination as to conductive contact states of the contact probes connected in series with the test points, based on the calculated electrical characteristic.

A fourth aspect of the disclosure provides the circuit board testing method of the third aspect, in which the determination is made prior to the four-terminal measurement performed on each wire on the circuit board.

According to the first and third aspects of the disclosure, the contact probes to be connected to the upstream-side voltage detection terminals or the downstream-side voltage detection terminals are connected in series. Therefore, it is possible to determine whether or not the contact probes connected to the upstream-side voltage detection terminals or the downstream-side voltage detection terminals are in conductive contact with the test points.

According to the second aspect of the disclosure, the determination as to the conductive contact states of the contact probes with the test points is made in such a manner that the power is applied from both the upstream side and the downstream side. Therefore, it is possible to eliminate an influence of an oxide film and the like and to make the determination with good accuracy. Moreover, it is possible to perform a process of removing an oxide film from the test point with which the contact probe connected to the voltage detection terminal is brought into conductive contact, simultaneously with the determination.

According to the fourth aspect of the disclosure, the conductive contact states are confirmed prior to the four-terminal measurement. Therefore, it is possible to certainly and easily confirm the conductive contact states.

The foregoing and other objects, features, aspects, and advantages of the disclosed invention will become more apparent from the following detailed description, when taken in conjunction with the accompanying drawings.

DETAILED DESCRIPTION

A description will be given of an exemplary embodiment of the disclosure.

Figure 1:
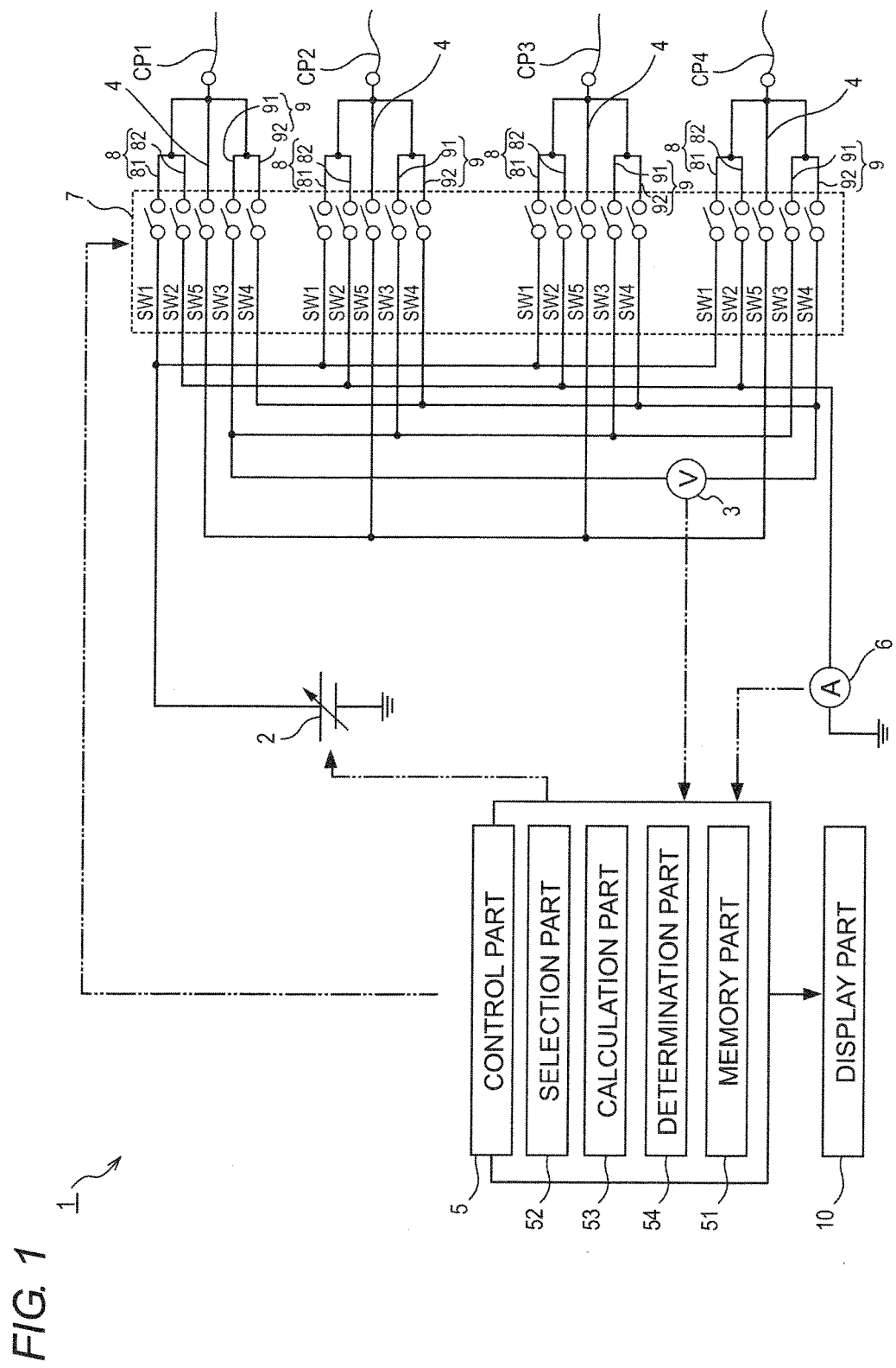
FIG. 1 illustrates a schematic configuration of a circuit board testing apparatus.

FIG. 1 illustrates a schematic configuration of a circuit board testing apparatus according to an exemplary embodiment of the disclosure.

A circuit board testing apparatus 1 according to an exemplary embodiment of the disclosure includes a power supply part 2, a voltage detection part 3, a plurality of connection terminals 4, a control part 5, a memory part 51, a selection part 52, a calculation part 53, a determination part 54, a current detection part 6, a switchover part 7, a plurality of power supply terminals 8, a plurality of voltage detection terminals 9, and a display part 10.

The circuit board testing apparatus 1 has a plurality of contact probes CP to be brought into conductive contact with test points defined on a plurality of wires formed on a circuit board. Each of the contact probes CP is capable of applying a predetermined potential or current to a predetermined test point or is capable of detecting an electrical characteristic (electric signal) from a predetermined test point.

FIG. 1 does not illustrate a circuit board to be subjected to a test, and test points with which the contact probes CP are brought into conductive contact. In practice, the contact probes CP are brought into conductive contact with test points defined on wires on a circuit board. In FIG. 1, the number of contact probes CP is four, but is not particularly limited. The number of contact probes CP is appropriately set in accordance with the number of and positions of test points defined on wires. In a continuity test to be conducted on a wire, two contact probes CP are brought into conductive contact with each of two test points defined in advance on the wire. A determination as to whether or not the wire is defective is made based on a calculated resistance value between the test points with which the contact probes CP are in conductive contact. In an exemplary embodiment of the disclosure, the power supply terminals 8 and the voltage detection terminals 9 are provided as illustrated in FIG. 1 in order to calculate a resistance value of a wire in a four-terminal measurement method. A switchover among these terminals allows a four-terminal measurement between test points.

Figure 2:
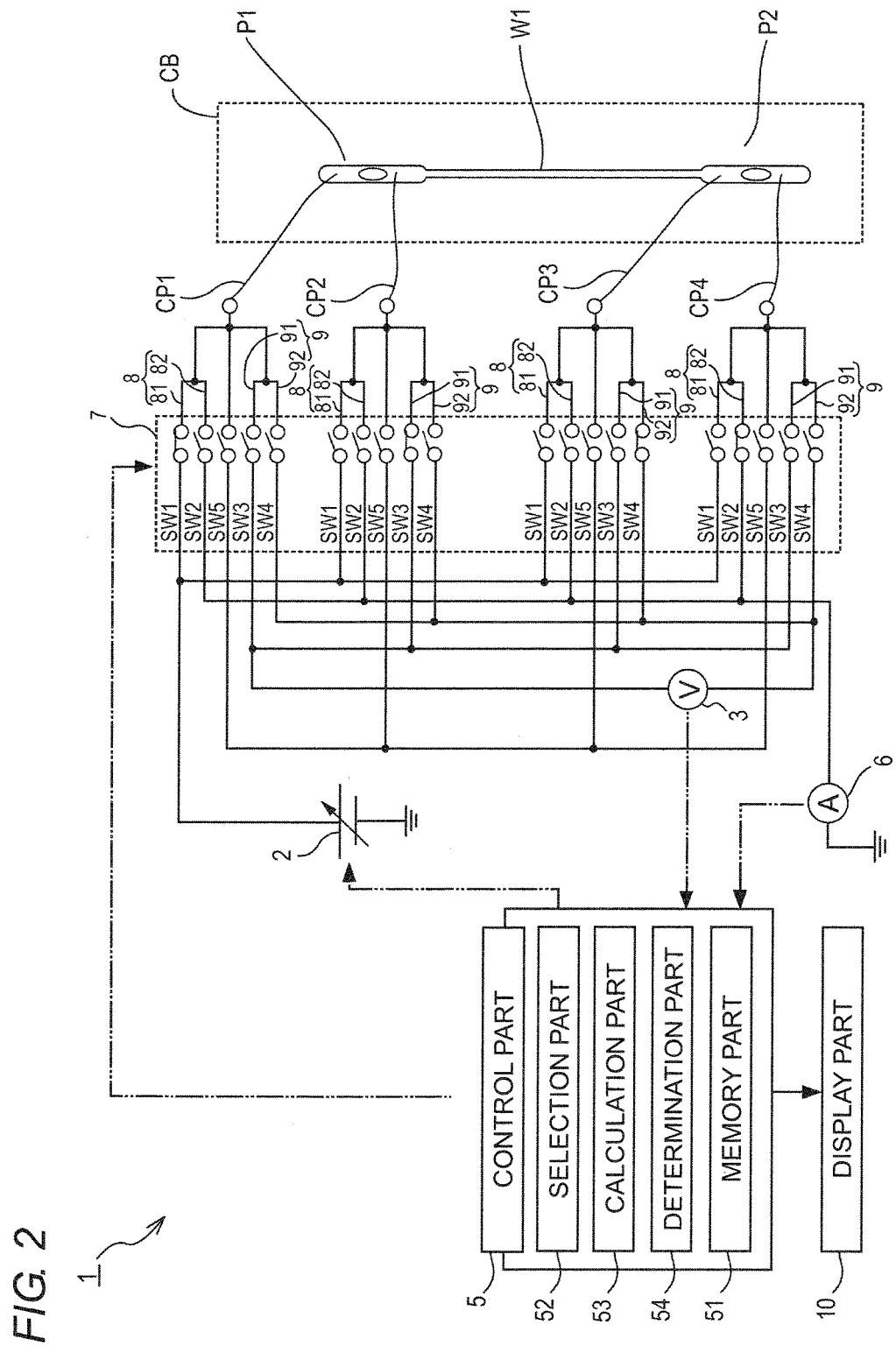
FIG. 2 illustrates a schematic configuration of the circuit board testing apparatus that performs a four-terminal measurement.

In an example illustrated in FIG. 2, a first test point P1 and a second test point P2 are defined on a wire W1 formed on a circuit board CB, and two contact probes CP are in conductive contact with each of the first test point P1 and the second test point P2. In the case illustrated in FIG. 2, the wire W1 is subjected to the four-terminal measurement. In order to perform the four-terminal measurement on the wire W1, for example, the contact probe CP1, which is in conductive contact with the first test point P1, is connected to an upstream side of the power supply part 2 via an upstream-side power supply terminal 81. Moreover, the contact probe CP4, which is in conductive contact with the second test point P2, is connected to a downstream side of the power supply part 2 via a downstream-side power supply terminal 82. On the other hand, the contact probe CP2, which is in conductive contact with the first test point P1, is connected to an upstream side of the voltage detection part 3 via an upstream-side voltage detection terminal 91. Moreover, the contact probe CP3, which is in conductive contact with the second test point P2, is connected to a downstream side of the voltage detection part 3 via a downstream-side voltage detection terminal 92. Thereafter, a resistance value between the first and second test points P1 and P2 on the wire W1 is calculated based on measurement power (current) applied to the wire W1 by the power supply part 2 and a voltage detected from the wire W1 by the voltage detection part 3.

The power supply part 2 is configured to apply power to a wire to be subjected to a test (more specifically, between test points defined on the wire) in order to determine whether or not the wire is defective. Specific examples of the power supply part 2 may include a variable voltage source, a current controller, and the like. In a continuity test, the power supply part 2 is set to appropriately adjust a voltage so as to apply a predetermined potential or is set to apply a predetermined current. The power supply part 2 may be set to apply a voltage of about 0 to 500 V between the test points. Moreover, the power supply part 2 may bet set to apply a current of about 0 to 1 A, for example, a current of 20 mA.

The voltage detection part 3 is configured to detect a potential difference (voltage) between test points, based on the power applied by the power supply part 2. Examples of the voltage detection part 3 may include a voltmeter and the like. However, the voltage detection part 3 is not particularly limited to these examples as long as it can detect a voltage between test points. The voltage detection part 3 is capable of detecting a voltage between test points, and therefore may be used for controlling a voltage to be applied between test points by the power supply part 2.

The connection terminals 4 are disposed to connect the contact probes CP in series. The connection terminals 4 are provided for the contact probes CP in a one-to-one correspondence to connect predetermined contact probes CP to one another. In the example illustrated in FIG. 1, the connection terminals 4 are provided for the four contact probes CP (CP1 to CP4) in a one-to-one correspondence. For example, in order to connect the contact probe CP1 and the contact probe CP2 in series, the connection terminal 4 for the contact probe CP1 and the connection terminal 4 for the contact probe CP2 are connected to each other. In the example illustrated in FIG. 1, switch elements SW5 are provided for the connection terminals 4 in a one-to-one correspondence. The switch elements SW5 are closed or opened to establish a connection among the contact probes CP. In the example illustrated in FIG. 1, the connection terminals 4 are connected to a single line. However, the number of lines is not particularly limited and may be changed in accordance with the number of contact probes CP and the connection states of the contact probes CP. The detailed description thereof will be given later.

The connection terminals 4 are used for determining whether or not the contact probes CP are in conductive contact with test points P. As will be described later, the determination is made in a state in which the connection terminals 4 connect in series the contact probes CP which are in contact with the test points P and are to be connected to the voltage detection terminals 9 in the four-terminal measurement method. In this case, the contact probes CP, which are to be connected to the voltage detection terminals 9, are connected in series to form a closed circuit. The conductive contact states of the contact probes CP are measured in such a manner that power is applied to the closed circuit. The conductive contact states of the contact probes CP, which are to be connected to the voltage detection terminals 9, with the test points P are determined based on a result of the measurement. For example, if the contact probes CP, which are to be connected to the voltage detection terminals 9, are in conductive contact with the test points P, power (current) is applied to the closed circuit. As a result, it is possible to calculate a resistance value based on the power. However, if the contact probes CP are not in conductive contact with the test points P, no power is applied to the closed circuit. As a result, it is impossible to calculate a resistance value based on the power. As described above, it is determined whether or not the contact probes CP, which are to be connected to the voltage detection terminals 9, are in conductive contact with the test points P.

The control part 5 is configured to transmit and receive processing signals allowing the circuit board testing apparatus 1 to conduct the continuity test on a circuit board CB. The control part 5 is also configured to perform predetermined arithmetic processing based on received electric signals. The control part 5 is also configured to confirm conductive contact states of contact probes CP with test points P, based on the electric signals. The control part 5 includes the memory part 51, the selection part 52, the calculation part 53, and the determination part 54.

The memory part 51 stores therein various kinds of information for conducting the test on the circuit board CB.

Examples of the information may include information on a value of a current to be applied between the test points P (current information), information on a value of a voltage to be detected (voltage information), information on coordinates of each test point P, information on order of the test points P to be subjected to the test, and the like. In the example illustrated in FIG. 2, the first test point P1 and the second test point P2 are defined on the wire W1 on the circuit board CB to be subjected to the test. In this case, the memory part 51 stores therein information on coordinates of each of the first test point P1 and the second test point P2 on the circuit board CB. The memory part 51 also stores therein information for connecting the contact probe CP1, which is in conductive contact with the first test point P1, to the upstream-side power supply terminal 81. The memory part 51 also stores therein information for connecting the contact probe CP2, which is in conductive contact with the first test point P1, to the upstream-side voltage detection terminal 91. These pieces of information in the memory part 51 are used for operating the selection part 52 and the like to be described later. The test is conducted in such a manner that the selection part 52 and the like operate based on these pieces of information. The memory part 51 also stores therein information on a measured current value or voltage value (between the first test point P1 and the second test point P2) of the wire W1. Moreover, the memory part 51 stores therein information on a calculated resistance value and the like. Further, the memory part 51 stores therein information on results of determination as to the conductive contact states of the contact probes CP with the test points P. The respective pieces of information in the memory part 51 are appropriately set and stored while being associated with the information on the wires W or test points P on the circuit board CB.

The calculation part 53 performs predetermined processing based on information and numeric values stored in the memory part 51. The calculation part 53 calculates resistance information corresponding to a resistance value between test points, based on current information of a current applied between the test points by the power supply part 2, and voltage information of a voltage detected between the test points by the voltage detection part 3. Specifically, the calculation part 53 divides the voltage information (=V) by the current information (=I) to calculate the resistance information (=R) (R=V/I). The resistance information (resistance value R) calculated by the calculation part 53 is stored in the memory part 51 in conjunction with the calculated information between the test points.

The calculation part 53 is capable of calculating a resistance value between predetermined test points P, as described above. More specifically, the calculation part 53 is capable of calculating a resistance value for conducting the continuity test between the test points P defined on the wire W (a first resistance value) and a resistance value for confirming the conductive contact state of the contact probe CP with the test point P (a second resistance value). The first and second resistance values are stored in the memory part 51, and are utilized by the determination part 54 as will be described later.

The determination part 54 makes a predetermined determination based on the resistance value calculated by the calculation part 53. The determination part 54 determines whether or not the wire W is defective, based on the first resistance value. For example, the determination part 54 compares the first resistance value with a reference resistance value set in advance, thereby determining whether or not the wire W (between the test points P) is defective. The reference resistance value is obtained in advance from a resistance value between test points defined on a wire on a non-defective circuit board. Then numeric values within a predetermined range are set based on the resistance value such that a wire having a resistance value within the predetermined range can be determined as a non-defective. The numeric values are stored in the memory part 51. If the calculated first resistance value falls within the predetermined range, the determination part 54 determines the wire W as a non-defective. If the calculated first resistance value falls outside the predetermined range, the determination part 54 determines the wire W as a defective. A result of the determination by the determination part 54 is stored as determination result information in the memory part 51. If the determination part 54 determines the wire W as a defective, the memory part 51 stores therein a fact that the wire W is defective, and a fact that the circuit board CB is also defective.

The determination part 54 also determines whether or not the conductive contact state of the contact probe CP with the test point P is favorable, based on the second resistance value. For example, the determination part 54 compares the second resistance value with a reference resistance value set in advance, thereby determining whether or not the conductive contact state is favorable. If the conductive contact state of the contact probe CP with the test point P is favorable, power is supplied to the closed circuit formed of the contact probes CP connected in series. Therefore, a predetermined resistance value can be calculated. The resistance value, in the case where the contact probes CP to be connected to the voltage detection terminals 9 are connected in series, is calculated as a numeric value in design. Then numeric values within a predetermined range are set based on the resistance value such that the conductive contact state can be determined as being favorable or unfavorable. The numeric values are stored in the memory part 51. As in a case similar to that of the first resistance value, if the second resistance value falls within the predetermined range, the determination part 54 determines the conductive contact state as being favorable. If the second resistance value falls outside the predetermined range, the determination part 54 determines the conductive contact state as being unfavorable. A result of the determination by the determination part 54 is stored as determination result information in the memory part 51. If the determination part 54 determines the conductive contact state as being unfavorable, a testing jig is spaced apart from the circuit board CB and then is brought into contact with the circuit board CB again. Thereafter, the determination part 54 determines whether or not the conductive contact state is favorable. The reference resistance value for determining the second resistance value can be set as described above. However, the conductive contact state of the contact probe CP, which is connected to the voltage detection terminal 9, with the test point P refers to whether or not there is electrical continuity between the contact probe CP and the test point P. Therefore, the reference resistance value may be set in consideration of whether or not a current flows through the electrical closed circuit formed of the contact probes CP connected in series.

The circuit board testing apparatus 1 also includes a movement part (not illustrated). The movement part is configured to bring a testing jig (not illustrated) close to or separate from the circuit board CB. The movement part allows the testing jig to be brought into contact with the circuit board CB or to be spaced apart from the circuit board CB. The testing jig may be moved such that the pair of contact probes CP, which are in contact with the test point P, is moved in a plane direction of the circuit board CB (a movement by a combination of an x-axis direction and/or a y-axis direction and/or a θ-rotation direction). Alternatively, the testing jig may be moved such that the pair of contact probes CP is spaced apart from the test point P and then is brought into contact with the test point P again (a movement in a z-axis direction). Alternatively, the testing jig may be moved such that the pair of contact probes CP achieves the above two movements in a combined manner. If the conductive contact state of the contact probe CP with the test point P is unfavorable, the movement part allows the contact probe CP to be brought into contact with the test point P again such that the conductive contact state becomes favorable.

The selection part 52 is configured to select two test points P from among the plurality of test points P defined on the wires W on the circuit board CB, thereby identifying the wire W to be subjected to the test. In order to conduct the test on all the wires W, the selection part 52 successively selects two test points P. The selection part 52 continuously selects two test points P until the resistance values of all the wires W are measured.

For example, the selection part 52 selects two test points P to identify the wire W to be subjected to the test as follows. That is, the memory part 51 stores therein order of test points P to be subjected to the test, in advance, and the selection part 52 selects two test points P in accordance with this order. The method of selecting two test points P is not particularly limited as long as the two test points P on the wire W to be subjected to the test are selected in orderly sequence from among the plurality of test points P.

In the four-terminal measurement, the selection part 52 selects the upstream-side power supply terminal 81, the downstream-side power supply terminal 82, the upstream-side voltage detection terminal 91, and the downstream-side voltage detection terminal 92 for the selected two test points P. Specifically, the selection part 52 selects the test point P1 and the test point P2 to identify the wire W to be subjected to the test. Next, the selection part 52 selects the upstream-side power supply terminal 81 and the upstream-side voltage detection terminal 91 for the test point P1. Moreover, the selection part 52 selects the downstream-side power supply terminal 82 and the downstream-side voltage detection terminal 92 for the test point P2.

In order to apply power for conducting the continuity test between the test points P on the wire W to be subjected to the test, the upstream-side power supply terminal 81 is electrically connected to one of the test points P and the downstream-side power supply terminal 82 is electrically connected to the other test point P, in the circuit board testing apparatus 1. In order to detect the voltage between the test points P, moreover, the upstream-side voltage detection terminal 91 is electrically connected to one of the test points P and the downstream-side voltage detection terminal 92 is electrically connected to the other test point P.

In the example illustrated in FIG. 2, the first test point P1 and the second test point P2 are defined on the wire W1 on the circuit board CB. The wire W1 is subjected to the test by measuring the resistance value between the first test point P1 and the second test point P2. In the four-terminal measurement, the contact probe CP1 and the contact probe CP2 are brought into contact with the first test point P1, and the contact probe CP3 and the contact probe CP4 are brought into contact with the second test point P2. In the example illustrated in FIG. 2, the contact probe CP1 and the contact probe CP2 are disposed as the pair of contact probes, and the contact probe CP3 and the contact probe CP4 are disposed as the pair of contact probes.

In order to measure the resistance value between the first test point P1 and the second test point P2, the switch element SW1 for the contact probe CP1, which is in contact with the first test point P1, is closed to establish an electrical connection between the contact probe CP1 and the upstream-side power supply terminal 81 connected to the upstream side of the power supply part 2. Moreover, the switch element SW3 for the contact probe CP2, which is also in contact with the first test point P1, is closed to establish an electrical connection between the contact probe CP2 and the upstream-side voltage detection terminal 91 connected to the upstream side of the voltage detection part 3. On the other hand, the switch element SW4 for the contact probe CP3, which is in contact with the second test point P2, is closed to establish an electrical connection between the contact probe CP3 and the downstream-side voltage detection terminal 92 connected to the downstream side of the voltage detection part 3. Moreover, the switch element SW2 for the contact probe CP4, which is also in contact with the second test point P2, is closed to establish an electrical connection between the contact probe CP4 and the downstream-side power supply terminal 82 connected to the downstream side of the power supply part 2.

These switch elements SW are controlled to apply power between the first test point P1 and the second test point P2 and to detect a voltage between the first test point P1 and the second test point P2. The calculation part 53 calculates the resistance value between the first test point P1 and the second test point P2 from the current value (current information) and the voltage value (voltage information). The control of the switch elements SW is not particularly limited. In the above description, for example, the upstream side and the downstream side may be replaced with each other.

Figure 3:
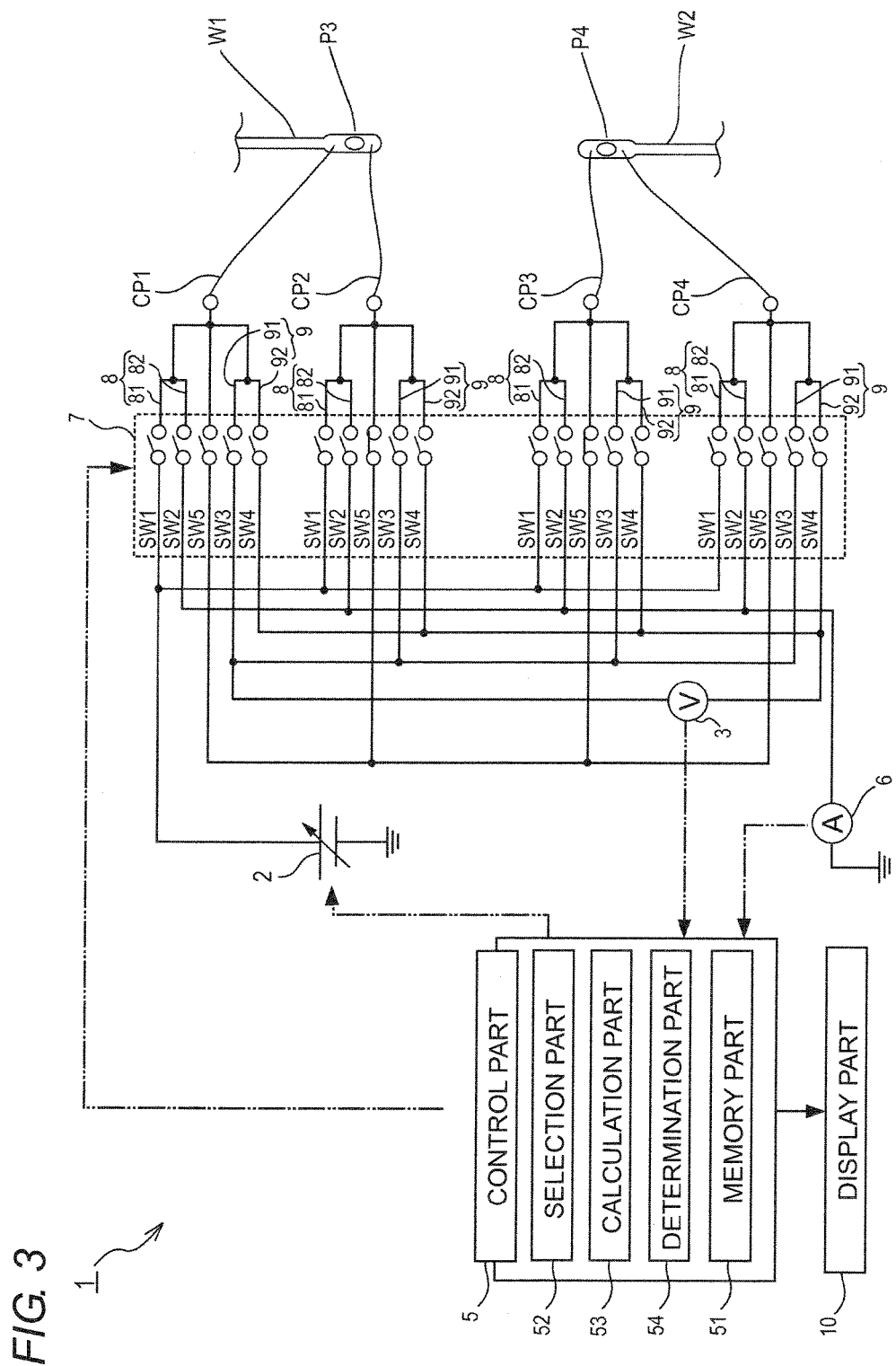
FIG. 3 illustrates a schematic configuration of the circuit board testing apparatus in which connection terminals are used.

The selection part 52 is capable of controlling a serial connection among the contact probes CP via the connection terminals 4. The switch elements SW5 are provided for the connection terminals 4 in a one-to-one correspondence for each contact probe CP. The switch elements SW5 are closed to connect the corresponding contact probes CP in series. In an example illustrated in FIG. 3, a wire W1 and a wire W2 are each subjected to the test. In this case, the contact probe CP1 and the contact probe CP2 are brought into contact with a test point P3 defined on the wire W1. Moreover, the contact probe CP3 and the contact probe CP4 are brought into contact with a test point P4 defined on the wire W2. In order to connect the contact probe CP2 and the contact probe CP3 in series, the switch element SW5 for the connection terminal 4 connected to the contact probe CP2 is closed and, simultaneously, the switch element SW5 for the connection terminal 4 connected to the contact probe CP3 is closed. The contact probe CP2 and the contact probe CP3 are connected in series in such a manner that the two switch elements SW5 are closed as described above. On the other hand, the switch elements SW1 to SW4 provided in correspondence with the contact probe CP2 as well as the switch elements SW1 to SW4 provided in correspondence with the contact probe CP3 are opened. For convenience of the description, FIG. 3 partially illustrates the wire W1 and the wire W2.

The switchover part 7 includes the plurality of switch elements SW for electrically connecting the power supply terminals 8, the voltage detection terminals 9, or the connection terminals 4 to the corresponding contact probes CP. The switchover part 7 controls the closed or opened states of the respective switch elements SW, based on operation signals from the selection part 52. Therefore, the switching operation of the switchover part 7 allows a selection of two test points on a wire to be subjected to the test, and also allows a connection among desired contact probes CP.

The power supply terminals 8 are connected to the test points P on the respective wires W to be subjected to the test, via the contact probes CP to apply power between the test points P. Each of the power supply terminals 8 includes the upstream-side power supply terminal 81 for connecting the test point P to the upstream side (positive electrode side) of the power supply part 2, and the downstream-side power supply terminal 82 for connecting the test point P to the downstream side (negative electrode side) of the power supply part 2. In each of the power supply terminals 8, the upstream-side power supply terminal 81 and the downstream-side power supply terminal 82 may be electrically connected to the test point P via protective resistors, respectively. In the switchover part 7, the switch elements SW are provided for the upstream-side power supply terminals 81 and downstream-side power supply terminals 82. The switchover part 7 closes or opens the switch elements SW to control the connection states of the upstream-side power supply terminals 81 and downstream-side power supply terminals 82. Each of the protective resistors is used as a resistor for electrostatic discharge protection.

The voltage detection terminals 9 are connected to the test points P on the respective wires W via the contact probes CP to detect a voltage for detecting an electrical characteristic between the test points P. Each of the voltage detection terminals 9 includes the upstream-side voltage detection terminal 91 for connecting the test point P to the upstream side (positive electrode side) of the voltage detection part 3, and the downstream-side voltage detection terminal 92 for connecting the test point P to the downstream side (negative electrode side) of the voltage detection part 3. In each of the voltage detection terminals 9, the upstream-side voltage detection terminal 91 and the downstream-side voltage detection terminal 92 may be electrically connected to the test points P on the wire W via protective resistors. In the switchover part 7, the switch elements SW are provided for the upstream-side voltage detection terminals 91 and downstream-side voltage detection terminals 92. The switchover part 7 closes or opens the switch elements SW to control the connection states of the upstream-side voltage detection terminals 91 and downstream-side voltage detection terminals 92.

With regard to the power supply terminals 8, the voltage detection terminals 9, and the connection terminals 4, as illustrated in FIG. 1, five terminals are provided for one contact probe CP to be brought into conductive contact with a test point P. Moreover, the switch elements SW (SW1 to SW5) are provided for controlling the electrical connections of the five terminals to the contact probe CP. In FIG. 1, the switch element SW1 is provided for controlling the electrical connection of the upstream-side power supply terminal 81. The switch element SW3 is provided for controlling the electrical connection of the upstream-side voltage detection terminal 91. The switch element SW2 is provided for controlling the electrical connection of the downstream-side power supply terminal 82. The switch element SW4 is provided for controlling the electrical connection of the downstream-side voltage detection terminal 92. The switch element SW5 is provided for controlling the electrical connection of the connection terminal 4.

In the schematic configuration of the circuit board testing apparatus 1 illustrated in FIG. 1, the current detection part 6 is provided for detecting an electrical characteristic between test points in a case where the power supply part 2 applies a predetermined potential between the test points. The current detection part 6 is capable of detecting the electrical characteristic (current value). The current detection part 6 is capable of detecting an amount of current in the case where the power supply part 2 applies the predetermined potential. The current detection part 6 is also capable of performing feedback control on a current flowing into the power supply part 2, based on the detected current value. Examples of the current detection part 6 may include an ammeter and the like.

The display part 10 displays thereon a result of measurement between test points and a result of the test on a circuit board. If the control part 5 determines that the conductive contact state of the contact probe CP of the testing jig with the test point P is unfavorable, the display part 10 also displays thereon a fact that the conductive contact state is unfavorable. Alternatively, the display part 10 displays thereon a notification that the conductive contact state is unfavorable, and therefore the testing jig is spaced apart from the circuit board CB and then is brought into contact with the circuit board CB again. For example, the display part 10 displays the test result and the notification, using massages such as "FAVORABLE", "UNFAVORABLE", "ABNORMAL", and "CONTACT AGAIN" with regard to the conductive contact state.

The foregoing description concerns the configuration of the circuit board testing apparatus 1.

Figure 4:
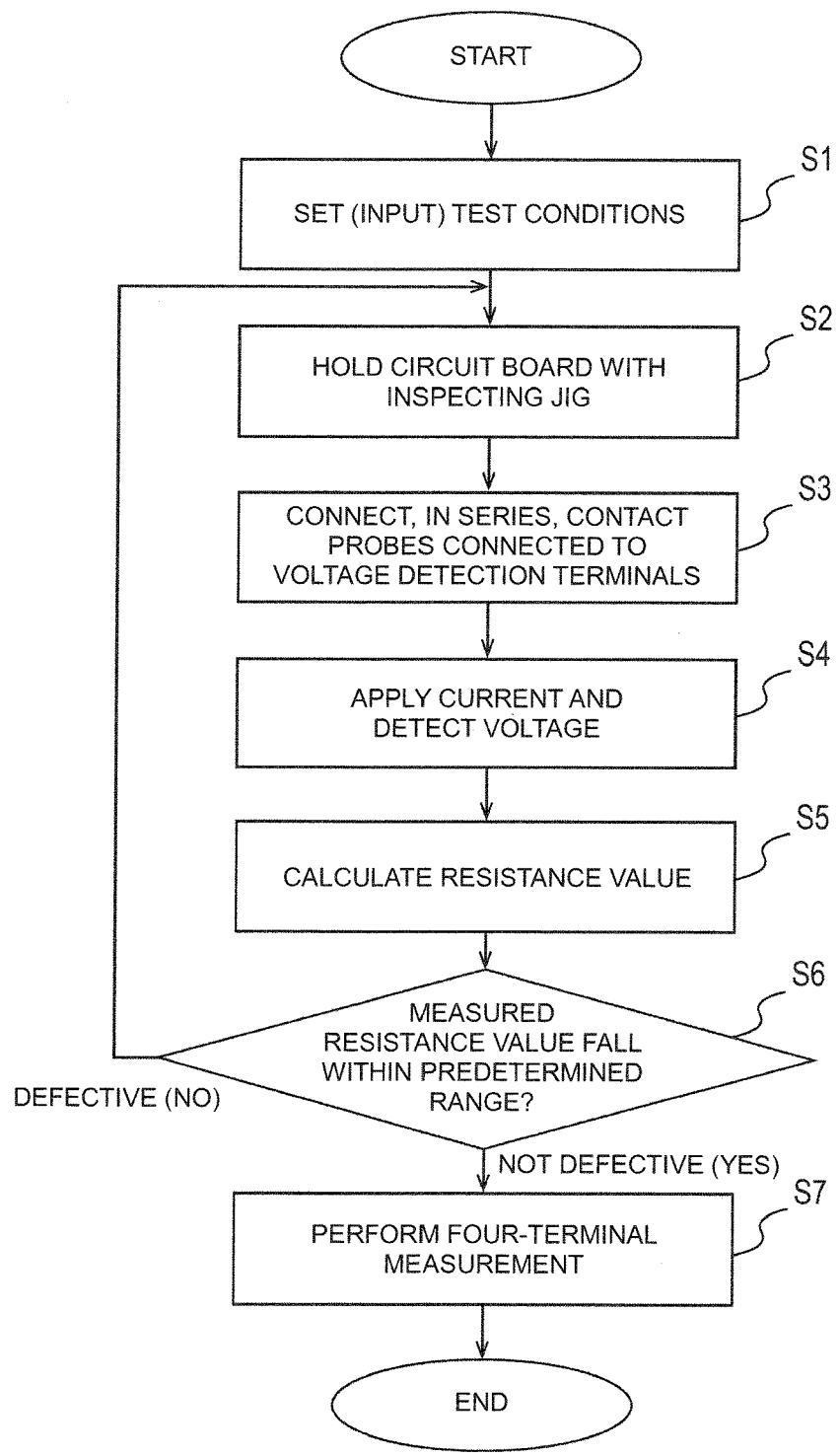
FIG. 4 is a flowchart illustrating operations of the circuit board testing apparatus.

Next, a description will be given of operations of the circuit board testing apparatus 1. FIG. 4 is a flowchart illustrating the operations of the circuit board testing apparatus 1. The circuit board testing apparatus 1 is configured to easily determine whether or not the contact probes CP of the testing jig are securely in conductive contact with desired test points P.

First, a user inputs information on the circuit board CB to be subjected to the test, to the memory part 51 of the circuit board testing apparatus 1 (S1). Specifically, the user inputs information on positions of the test points P to be subjected to the test, information on order of the test points P to be subjected to the test, information on design of the test points P defined on the circuit board CB, and the like. The memory part 51 also stores therein current information of a current to be applied between the test points P on the circuit board CB to be subjected to the test, information on a kind of the circuit board CB, and the like. The memory part 51 also stores therein a reference resistance value for determining whether or not the wire W is defective (whether or not the resistance value between the test points P is acceptable), for each wire W (for each two test points P). In order to confirm conductive contact states of the contact probes CP of the testing jig with the test points P, the memory part 51 also stores therein information on the contact probes CP to be connected to the voltage detection terminals 9 for performing the four-terminal measurement method on the test points P, and information on the connection terminals 4 for connecting the contact probes CP in series.

When the information for conducting the test is stored in the circuit board testing apparatus 1, the circuit board CB to be subjected to the test is mounted on a workbench of the circuit board testing apparatus 1. The circuit board CB is mounted at a predetermined position, and then is transferred to a predetermined test position. When the circuit board CB is transferred to the predetermined test position, the multi-stylus circuit board testing jig (the testing jig having the plurality of contact probes CP) holds the circuit board CB from front and back surfaces of the circuit board CB such that the pair of contact probes CP is brought into contact with each test point P. Thus, the circuit board testing apparatus 1 stands ready to conduct the test (S2).

In the state in which the testing jig is in contact with the circuit board CB, two contact probes CP need to be in conductive contact with one test point P. In order to confirm the conductive contact states of the contact probes CP with the test point P, the selection part 52 selects the contact probes CP to be connected to the voltage detection terminals 9, from the contact probes CP which are in conductive contact with the test points P. The switch elements SW5 for the connection terminals 4 are closed to connect the selected contact probes CP in series (S3).

Figure 5:
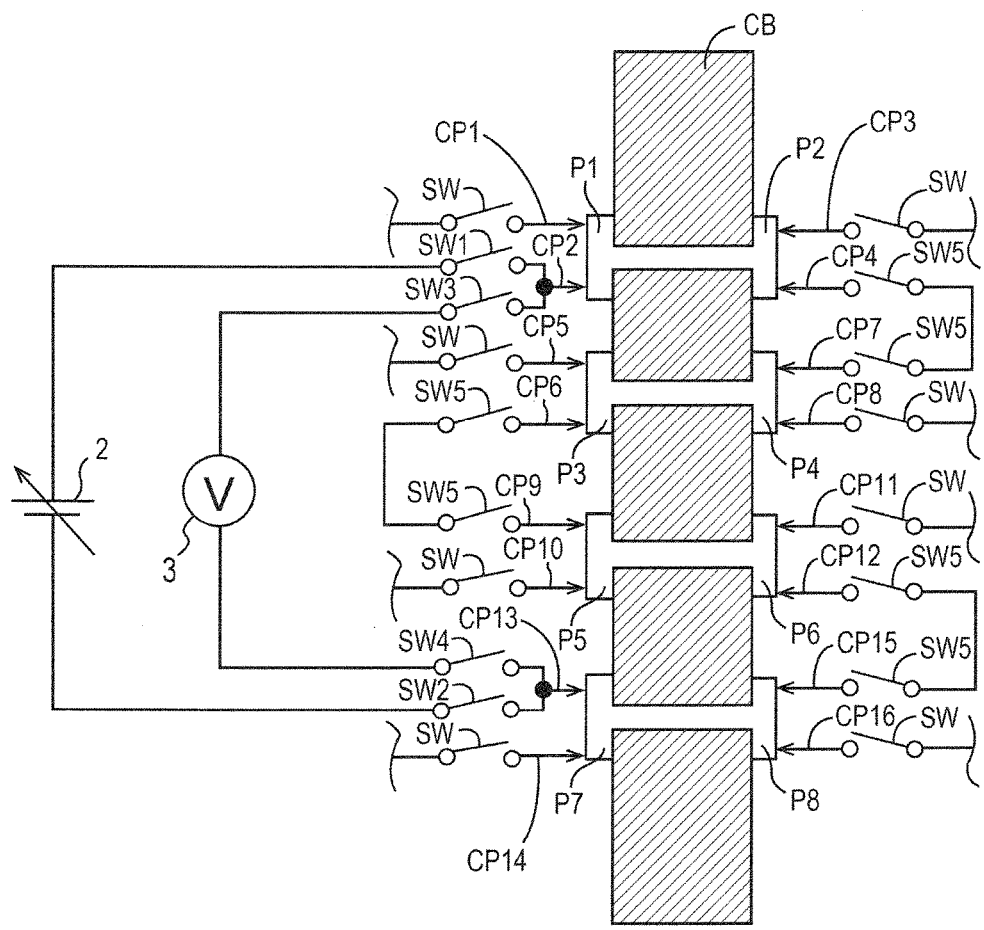
FIG. 5 illustrates a schematic configuration in which contact probes of a testing jig are in contact with a circuit board, but are not connected to terminals.
Figure 6:
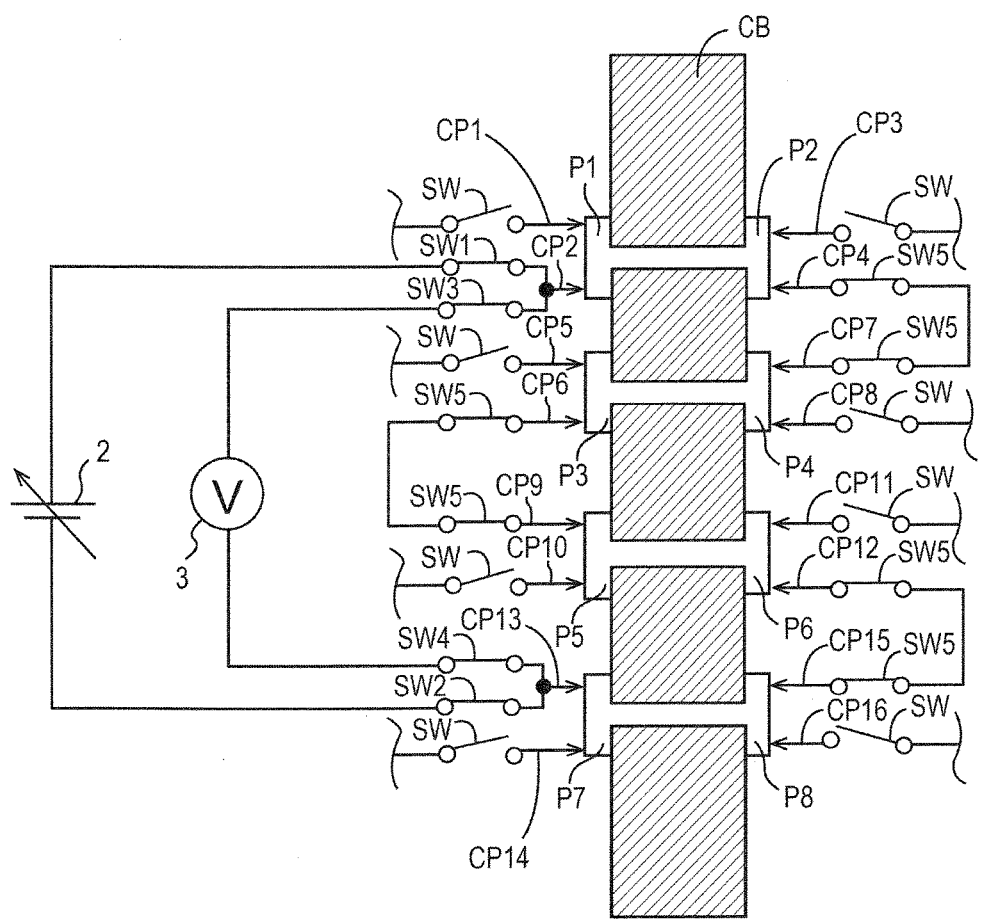
FIG. 6 illustrates a schematic configuration in which the connection terminals and others are used.

FIG. 5 schematically illustrates a state in which two contact probes CP are in contact with each of the test points P (P1 to P8) defined on the circuit board CB. FIG. 6 schematically illustrates a state in which the contact probes CP to be connected to the voltage detection terminals 9 are connected in series in order to confirm the conductive contact states of the contact probes CP with the test points P. In the examples illustrated in FIGS. 5 and 6, four wires are formed on the circuit board CB, the test points P (P1 to P8) are defined on two ends of each wire, and the contact probes CP1 to CP16 are in contact with the corresponding test points P. With reference to FIGS. 5 and 6, the operations of the circuit board testing apparatus 1 will be described. The upstream-side power supply terminals 81, the downstream-side power supply terminals 82, the upstream-side voltage detection terminals 91, the downstream-side voltage detection terminals 92, and the connection terminals 4 are provided in correspondence with these contact probes CP. However, FIGS. 5 and 6 do not illustrate all of the terminals, but illustrate the terminals to be used for confirming the conductive contact states of the contact probes CP with the test points P and the switch elements SW (SW1 to SW5) for the respective terminals, for convenience of the description. In FIGS. 5 and 6, the switch elements SW, which are not used, are opened.

First, the contact probes CP to be connected to the voltage detection terminals 9 are selected from these contact probes CP. Next, the switch elements SW5 for the connection terminals 4 are closed to connect the selected contact probes CP in series.

In the example illustrated in FIG. 5, the contact probes CP2, CP4, CP6, CP7, CP9, CP12, CP13, and CP15 are connected to the voltage detection terminals 9. Moreover, the contact probe CP2 is connected to the upstream-side power supply terminal 81 and the upstream-side voltage detection terminal 91, and the contact probe CP13 is connected to the downstream-side power supply terminal 82 and the downstream-side voltage detection terminal 92. The switch element SW1 and the switch element SW3 are closed to connect the contact probe CP2 to the power supply part 2 and the voltage detection part 3, respectively. The switch element SW2 and the switch element SW4 are closed to connect the contact probe CP13 to the power supply part 2 and the voltage detection part 3, respectively. The switch elements SW5 for the connection terminals 4 are closed to connect the contact probes CP4, CP6, CP7, CP9, CP12, and CP15 in series.

The contact probes CP1, CP3, CP5, CP8, CP10, CP11, CP14, and CP16 are connected to none of the terminals, and the respective switch elements SW (SW1 to SW5) are opened (see FIG. 6). Thus, a closed circuit is formed of the contact probes CP connected to the voltage detection terminals 9.

The power supply part 2 applies power to the closed circuit formed as illustrated in FIG. 6. The current applied from the power supply part 2 returns to the power supply part 2 via the contact probes CP2, CP4, CP7, CP6, CP9, CP12, CP15, and CP13. In the four-terminal measurement method, the contact probes CP, which are to be connected to the voltage detection terminals 9, are connected in series. Moreover, the voltage detection part 3 is connected to the contact probe CP2 and the contact probe CP13, thereby measuring a voltage value between the contact probes CP2 and CP13. The selection part 52 controls the closed or opened states of the switch elements SW in the switchover part 7 to form the closed circuit, and the voltage detection part 3 measures the voltage value (S4).

Next, the calculation part 53 calculates a resistance value from the current value of the power supply part 2 and the voltage value measured by the voltage detection part 3 (S5). The determination part 54 determines whether or not the contact probes CP connected to the voltage detection terminals 9 are in conductive contact with the test points P, based on the resistance value (S6). If the resistance value falls within the range of the reference resistance value (Yes in S6), the determination part 54 determines that the conductive contact states of the contact probes CP are favorable. On the other hand, if the resistance value falls outside the range of the reference resistance value (No in S6), the determination part 54 determines that the conductive contact states of the contact probes CP are unfavorable.

If the conductive contact states of the contact probes CP are favorable (Yes in S6), the circuit board testing apparatus 1 starts to measure a resistance value of the wire W on the circuit board CB by the four-terminal measurement method (S7). On the other hand, if the conductive contact states of the contact probes CP are unfavorable (No in S6), the testing jig is spaced apart from the circuit board CB. Thereafter, the testing jig is moved to hold the circuit board CB again (S2).

According to an exemplary embodiment of the disclosure, the circuit board testing apparatus 1 does not confirm the conductive contact states of the contact probes CP, which are to be connected to the power supply terminals 8, with the test points P. However, the power supply terminals 8 apply power to the test points P in measuring a resistance value between the test points P. Therefore, if the conductive contact states of the contact probes CP, which are to be connected to the power supply terminals 8, with the test points P are unfavorable, no power is applied to the test points P, and therefore the influence is exerted on the voltage detection part 3. Thus, it is understood that the conductive contact states of the contact probes CP, which are to be connected to the power supply terminals 8, with the test points P are unfavorable. Thereafter, the testing jig is spaced apart from the circuit board CB, and then holds the circuit board CB again.

Occasionally, the wire W has a failure and this failure exerts an influence in a case of confirming the conductive contact states of the contact probes CP connected to the voltage detection terminals 9, by connecting the contact probes CP in series. However, a probability that a wire has a failure is much lower than a probability that conductive contact states of contact probes are unfavorable. Therefore, detecting unfavorable conductive contact states of the contact probes CP first leads to improvement in test efficiency.

In confirming the conductive contact states by connecting the contact probes CP, which are to be connected to the voltage detection terminals 9, in series, the power supply part 2 may apply power in this confirmation and then apply power which is opposite in polarity (by replacing the positive and negative electrodes with each other or reversing the current flow). When the direction of current flow or the polarity of the current is changed with regard to the current applied firstly and the current applied secondly, an oxide film formed on the test point P can be removed from the test point P. As a result, it is possible to conduct the two tests with higher accuracy.

In the state in which the contact probes CP, which are to be connected to the voltage detection terminals 9, are in conductive contact with the test points P, the currents which are different in polarity from each other are applied to remove the oxide film from the test point P. Therefore, the removal of the oxide film, which has been conducted prior to the measurement, can be performed simultaneously with the measurement. Thus, it is possible to considerably improve the test efficiency.

The foregoing description concerns the basic operations of the circuit board testing apparatus 1.

The foregoing disclosure has been specifically described and illustrated in connection with certain illustrative embodiments. However, it is clearly understood that the embodiments are by way of illustration and example only and are not to be taken by way of limitation. The spirit and scope of the invention are limited only by the terms of the appended claims.

What is claimed is:

1. A circuit board testing apparatus for measuring at least one electrical characteristic of a wiring pattern formed of a plurality of wires on a circuit board, the wiring pattern having at least two test points defined thereon, the apparatus comprising:
at least two pairs of contact probes each of the pairs of contact probes configured to establish electrical contact with one of said test points, each contact probe comprising, respectively:
an upstream power terminal having a switchable connection to an upstream side of a power supply part, a downstream power terminal having a switchable connection to a downstream side of the power supply part, an upstream voltage detection terminal having a switchable connection to an upstream side of a voltage detection part, a downstream voltage detection terminal having a switchable connection to a downstream side of the voltage detection part, and a switchable connection terminal having a switchable connection to the respective contact probe; and
a control part configured to perform a measurement of a first value related to the at least one electrical characteristic of the wiring pattern, based on a determination of a second value related to a contact state of the at least two pairs of contact probes to the two respective test points.

2. The circuit board testing apparatus of claim 1 wherein the measurement of the first value is a four-terminal measurement.

3. The circuit board testing apparatus of claim 2 wherein the control part is configured to perform the determination the second value by:
holding the circuit board in contact with the contact probes,
connecting at least two pairs of contact probes together in a series via the respective connection terminals and the circuit board,
applying power from the power supply part to the series via at least one of said upstream power terminals and at least on one of said downstream power terminals,
measuring, using the voltage detection part, a voltage across the series via at least one of said upstream voltage detection terminals and one of said downstream voltage detection terminals; and
calculating the second value based on the measured voltage.

4. The circuit board testing apparatus of claim 3 wherein the control part further comprises:
a selection part configured to selectively switch said connections of the respective terminals of the respective contact probes;
a memory part;
a calculation part configured to calculate the first value and the second value, respectively;
a determination part configured to determine the condition of said contact states and the at least one electrical characteristic of said wiring pattern based on the calculated values.

5. The circuit board testing apparatus of claim 4, wherein the second value is a resistance value of the series.

6. The circuit board testing apparatus of claim 5 wherein the first value is a resistance value of the wiring pattern.

7. The circuit board testing apparatus of claim 6 wherein the memory part stores a predetermined range of resistance values corresponding to the first value and the second value, respectively.

8. The circuit board testing apparatus of claim 7 wherein the control part is configured to reposition the circuit board in contact with the contact probes based on a comparison of the second value to the predetermined range of resistance values.

9. A circuit board testing method comprising:
a) providing a testing apparatus configured to test a wiring pattern formed of a plurality of wires on a circuit board, the test based on a measurement of a first value, the testing apparatus having at least two pairs of contact probes, the contact probes each having: an upstream power terminal having a switchable connection to an upstream side of a power supply part, a downstream power terminal having a switchable connection to a downstream side of the power supply part, an upstream voltage detection terminal having a switchable connection to an upstream side of a voltage detection part, a downstream voltage detection terminal having a switchable connection to a downstream side of the voltage detection part, and a switchable connection terminal having a switchable connection to the respective contact probe;
b) holding the circuit board in contact with the contact probes;
c) connecting the at least two pairs of contact probes together in a series via the respective connection terminals and the circuit board;
d) applying power from the power supply part to the series via at least one of said upstream power terminals and at least one of said downstream power terminals;
e) measuring, using the voltage detection part, a voltage across the series via at least one of said upstream voltage detection terminals, and one of said downstream voltage detection terminals;
f) calculating a second value, for an electrical characteristic of the series based on the measured voltage; and
g) determining a contact state of the at least two pairs of contact probes, each pair to one of at least two test points defined on the wiring pattern, based on the second value.

10. The method of claim 9 wherein the testing apparatus is configured to perform a continuity test.

11. The method of claim 9 wherein determining in g) comprises comparing the second value to a predetermined range of second values for said characteristic.

12. The method of claim 11 further comprising:
h) performing a four-terminal measurement of the resistance of said wiring pattern to obtain said first value.

13. The method of claim 12 wherein g) is performed prior to h).

14. The method of claim 13 further comprising repeating b)-g) if the value compared in g) falls outside of the predetermined range of second values.

15. The method of claim 14
wherein the connecting in c) further comprises selectively switching said connections of the respective terminals of the respective contact probes via a selecting part, and
wherein said testing apparatus includes a control part comprising said selecting part, and a memory part for storing the values of said predetermined range of second values.

16. The method of claim 9 wherein the applying power in d) further comprises applying power alternately from said at least one upstream power terminal and then from said at least one downstream power terminal prior to e).

17. The method of claim 12 further comprising:
i) determining a test result of said electrical characteristic of the wiring pattern based on the first value.

18. The method of claim 17 wherein determining in i) comprises comparing the first value to a predetermined range of first values for said characteristic.

19. The method of claim 18 wherein said testing apparatus includes a memory part for storing the values of said predetermined range of first values.

20. A circuit board testing apparatus for conducting a continuity test on a wiring pattern formed of a plurality of wires on a circuit board, and performing a four-terminal measurement on test points defined on each wire with a pair of contact probes brought into conductive contact with each test point, in the continuity test,
the circuit board testing apparatus comprising:
a power supply part configured to apply power between the test points;
upstream-side power supply terminals provided for the contact probes in a one-to-one correspondence and connectable to an upstream side of the power supply part;
downstream-side power supply terminals provided for the contact probes in a one-to-one correspondence and connectable to a downstream side of the power supply part;
a voltage detection part configured to detect a voltage between the test points;
upstream-side voltage detection terminals provided for the contact probes in a one-to-one correspondence and connectable to an upstream side of the voltage detection part;
downstream-side voltage detection terminals provided for the contact probes in a one-to-one correspondence and connectable to a downstream side of the voltage detection part;
connection terminals provided for the contact probes in a one-to-one correspondence to connect the contact probes to one another;
a selection part configured to selectively connect the contact probes to the respective terminals; and
a control part configured to operate the power supply part, the voltage detection part, and the selection part to stimulate measurement processing for performing the four-terminal measurement,
wherein
the control part connects in series the contact probes to be connected to the upstream-side voltage detection terminals or the downstream-side voltage detection terminals, via the connection terminals, and
the control part allows the power supply part to apply power between the test points with which the contact probes connected in series are in contact, allows the voltage detection part to detect a voltage between the test points, and makes a determination as to conductive contact states of the contact probes with the test points, based on the detected voltage.

* * * * *